United States Patent
Sloey et al.

(10) Patent No.: US 9,033,716 B2
(45) Date of Patent: May 19, 2015

(54) PRINTED CIRCUIT BOARD CONNECTORS

(71) Applicant: Apple Inc., Cupertino, CA (US)

(72) Inventors: Jason Sloey, Austin, TX (US); Varun Sehrawat, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 125 days.

(21) Appl. No.: 13/952,935

(22) Filed: Jul. 29, 2013

(65) Prior Publication Data

US 2015/0031221 A1    Jan. 29, 2015

(51) Int. Cl.
  *H01R 12/00*  (2006.01)
  *H01R 12/50*  (2011.01)
  *H05K 1/11*   (2006.01)

(52) U.S. Cl.
  CPC ............... *H01R 23/722* (2013.01); *H05K 1/11* (2013.01)

(58) Field of Classification Search
  CPC ...... H01R 23/722; H01R 23/68; H01R 23/72; H05K 1/11
  USPC ...................................................... 439/65, 66
  See application file for complete search history.

(56) References Cited

U.S. PATENT DOCUMENTS

| | | |
|---|---|---|
| 6,854,985 B1 | 2/2005 | Weiss |
| 7,052,290 B1 * | 5/2006 | Thornton ............ 439/91 |
| 7,097,462 B2 * | 8/2006 | Ichikawa ............ 439/66 |
| 7,658,617 B1 | 2/2010 | Brodsky et al. |
| 7,997,907 B2 | 8/2011 | Tutt et al. |
| 8,308,512 B2 | 11/2012 | Ritter et al. |
| 2011/0095999 A1 | 4/2011 | Hayton |

OTHER PUBLICATIONS

Polymer Material Technology for Multimedia, Polymatech Co. Ltd., [online], retrieved Feb. 15, 2013. <URL: http://www.polymatech-usa.com/home.htm>.

* cited by examiner

*Primary Examiner* — Khiem Nguyen
(74) *Attorney, Agent, or Firm* — Treyz Law Group; Joseph F. Guihan

(57) ABSTRACT

Contact pads on structures such as printed circuits may be coupled to each other using printed circuit connectors such as board-to-board connectors. A printed circuit connector may have interlocking metal frame structures. The metal frame structures may be soldered to traces on the printed circuits. Rectangular openings in the metal frame structures may receive a rectangular contact array structure that is separate from the metal frame structures. The contact array structure may include a dielectric carrier structure and an array of conductive contacts. The dielectric carrier structure may align the contacts with respect to pads on the printed circuits to which the metal frame structures are soldered. The contacts may be formed from metal spring structures or conductive elastomeric structures that are compressed between respective printed circuit contact pads when the metal frame structures of a printed circuit connector are attached to each other.

20 Claims, 10 Drawing Sheets

PRINTED CIRCUIT BOARD CONNECTORS

BACKGROUND

This relates generally to connectors, and, more particularly, to printed circuit board connectors.

Electronic devices include integrated circuits and other components that are mounted on printed circuits. It is sometimes necessary to join the circuitry on printed circuits using connectors. For example, board-to-board connectors may be used to connect printed circuit boards to each other.

Board-to-board connectors generally require tight alignment during mating to avoid damage. This can make it challenging to assemble products that use such connectors. Even when extensive efforts are made to align board-to-board connectors properly, there is a risk for damage during the mating process. When damage arises during assembly, parts may need to be reworked or discarded.

Board-to-board connectors can be mounted on printed circuits using solder. Solder may be susceptible to corrosion if not isolated from the environment. To prevent undesired corrosion, solder joints in board-to-board connectors are often coated with a polymer coating. Masking fixtures or plastic protective caps may be used to ensure that contacts in a board-to-board connector are not exposed to polymer coating material when the solder is being coated, but the fixtures and protective caps that are available for masking board-to-board connectors tend to be complex and costly.

It would therefore be desirable to be able to provide improved printed circuit connectors.

SUMMARY

Circuitry on printed circuits may be interconnected using printed circuit board connectors. Printed circuits may have metal traces that are patterned to form interconnect paths and contact pads. Arrays of contact pads on printed circuits may be connected to each other using printed circuit connectors such as board-to-board connectors.

A printed circuit connector may have a pair of interlocking metal frame structures such as rectangular interlocking metal frames. The metal frame structures may be soldered to traces on printed circuits. Rectangular openings in the metal frame structures may receive a contact array structure that is separate from the metal frame structures. Alignment features such as plastic alignment posts on the metal frame structures may be configured to mate with corresponding recesses in the contact array structure to align the contact array structure relative to the pads on the printed circuits.

The contact array structure may include a dielectric carrier structure such as a rigid or elastomeric polymer structure and an array of conductive contacts. The dielectric carrier structure may align the conductive contacts with respect to the pads on the printed circuits to which the metal frame structures are soldered. The conductive contacts may be formed from metal spring structures or conductive elastomeric structures that are compressed between respective printed circuit contact pads when the metal frame structures of a printed circuit connector are attached to each other.

Further features, their nature and various advantages will be more apparent from the accompanying drawings and the following detailed description of the preferred embodiments.

DETAILED DESCRIPTION

Electronic components such as integrated circuits, discrete components such as inductors, resistors, and capacitors, switches, sensors, and other circuitry may be mounted on dielectric substrates in an electronic device. Interconnects may be formed from patterned metal traces or other conductive pathways on the dielectric substrates. The dielectric substrates in an electronic device may include layers of glass, layers of plastic, molded plastic structures, printed circuits, or other dielectric substrates.

Printed circuit substrates may include rigid printed circuit board substrates (e.g., rigid printed circuit boards formed from fiberglass-filled epoxy) and flexible printed circuit board substrates (e.g., flex circuits formed from flexible sheets of polyimide or layers of other flexible polymer). Signal lines on the printed circuit substrates may be formed from patterned metal traces or other conductive paths.

Connectors may be used to couple the components and conductive paths on one substrate to the components and conductive paths on another substrate. For example, a first printed circuit such as a first rigid printed circuit board or first flexible printed circuit may be coupled to a second printed circuit such as a second rigid printed circuit board or second flexible printed circuit using a board-to-board printed circuit connector. Printed circuit connectors may also be used to couple flexible and rigid printed circuits to other components.

A printed circuit connector may have a first portion (sometimes referred to as a jack or female connector structure) that is attached to a first printed circuit and may have a mating second portion (sometimes referred to as a plug or male connector structure). These printed circuit board structures may engage one another when mated to form a connection. Interlocking printed circuit connectors may also be formed using symmetrical connector structures (i.e., parts that include both male and female structures). Printed circuit connectors that include a plug and a jack are sometimes described herein as an example.

Figure 1:
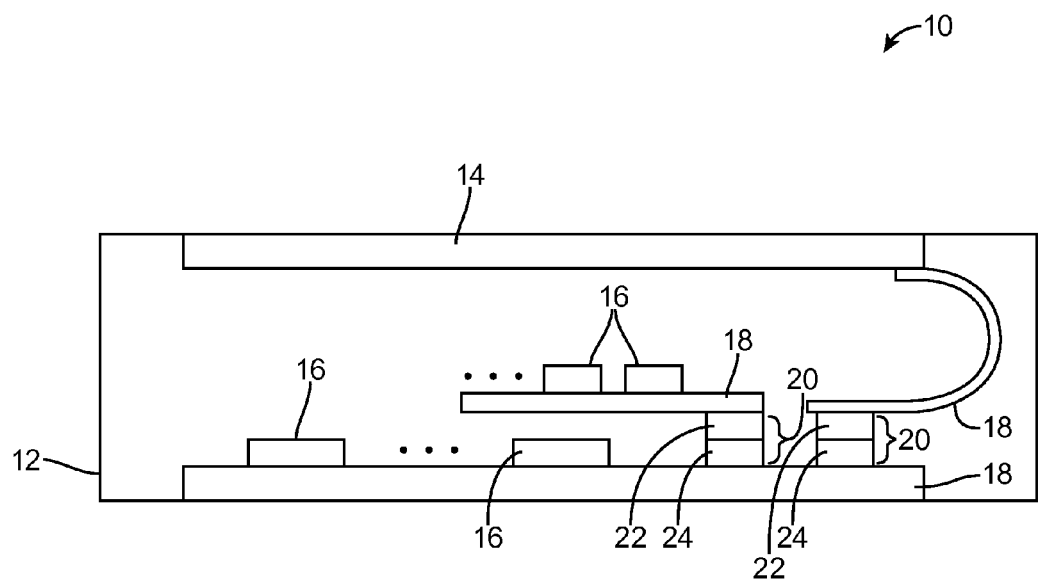
FIG. 1 is a cross-sectional side view of an illustrative electronic device of the type that may use printed circuit board connectors in accordance with an embodiment.

Printed circuit connectors may be used in electronic devices that include printed circuits. An illustrative electronic device of the type that may be provided with one or more printed circuit connectors is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, a set-top box, a desktop computer, a wireless router, or other electronic equipment.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of electrowetting display pixels, or display pixels based on other display technologies.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

Device 10 may contain components such as display 14 and other components 16. Components 16 may include integrated circuits, discrete components such as resistors, capacitors, and inductors, sensors, input-output devices, switches, status-indicator lights, audio components, and other circuits.

Components 16 may be mounted on printed circuits 18. Printed circuits 18 may include rigid printed circuit boards, flexible printed circuits, printed circuit structures of the type that include integral flexible tails extending from sections of rigid printed circuit board material (sometimes referred to as rigid flex printed circuits), or other printed circuit structures. Anisotropic conductive film or other conductive adhesive, solder, or other conductive materials may be used in coupling electrical components 16 to printed circuits 18. For example, anisotropic conductive film may be used to attach conductive traces on one end of a flexible printed circuit cable to display 14. Printed circuits such as flexible printed circuits that are used to form signal buses may have few or no components 16 (as an example).

Printed circuit connectors 20 may be used to couple printed circuits to other structures in device 10. For example, board-to-board connectors 20 may be used in coupling together respective printed circuits 18. The printed circuits that are coupled together in this way in device 10 may be rigid printed circuits, flexible printed circuits, and/or rigid flex printed circuits.

As shown in FIG. 1, printed circuit connectors 20 may each have a first connector structure 22 and a mating second connector structure 24. Mating printed circuit connector structures 22 and 24 may be provided with snaps or other interlocking engagement features to help hold the printed circuit connectors together.

Printed circuit connectors 20 may have an array of contacts for shorting contact pads on respective printed circuits to each other. The array of contacts may be aligned with respect to the pins using a dielectric carrier in a contact array structure.

The contact array structure may be received within openings in a pair of mating connector structures and may form signal paths through the connector for carrying data and/or power. For example, the contact array structure may have the shape of a rectangular box that is received within a rectangular opening formed in the interior of a pair of mating rectangular ring-shaped connector structures. When received within the rectangular opening in this way, the connector structures surround the periphery of the contact array structure. The connector structures may help align the contact array structure.

The contact array structure may include multiple connector contacts. The connector contacts may be formed from stamped metal structures or other metal structures that are carried by a dielectric carrier such as a plastic carrier or may be formed from conductive elastomeric contact structures that are embedded within a dielectric elastomeric structure.

Figure 2:
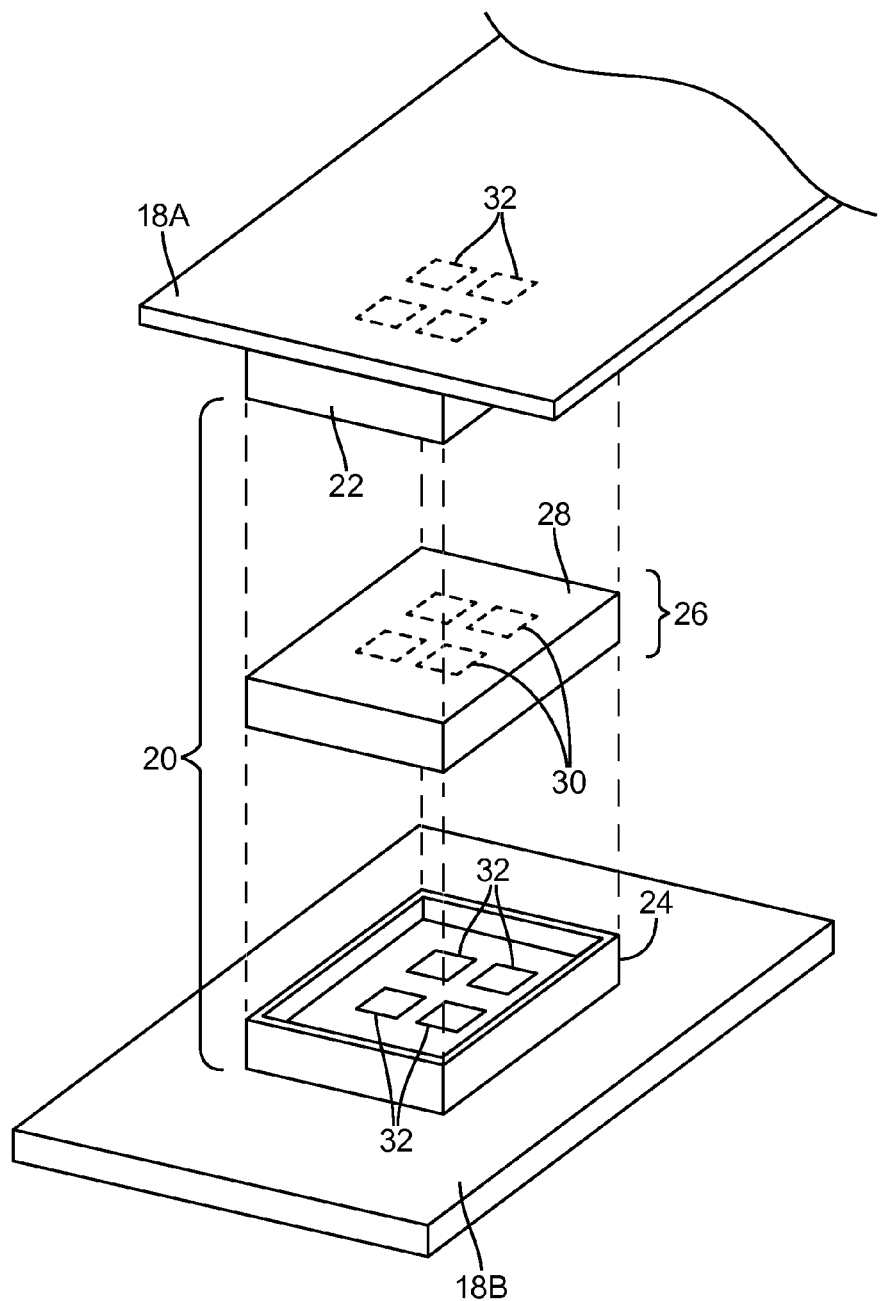
FIG. 2 is an exploded perspective view of a pair of printed circuits being coupled by an illustrative printed circuit connector in accordance with an embodiment.

FIG. 2 is an exploded perspective view of an illustrative connector. As shown in FIG. 2, connector 20 may have mating connector structures 22 and 24. Connector structure 22 may be mounted to printed circuit 18A. Connector structure 24 may be mounted to printed circuit 18B. Connector structures 22 and 24 may have the shape of rectangular rings or other shapes that have openings. The openings may receive contract array structure 26 when connector 20 is assembled.

Metal traces in printed circuits 18A and 18B may be patterned to form contact pads. Contact array structure 26 may include dielectric carrier structure 28 and connector contacts 30. Dielectric carrier structure 28 may be formed from a polymer or other dielectric that helps electrically isolate and mechanically support connector contacts 30. Connector contacts 30 may be formed from conductive structures that short respective pairs of contact pads 32 together. Each connector contact 30 of FIG. 2 may, for example, short a respective one of contact pads 32 on printed circuit 18B to a corresponding one of contact pads 32 on printed circuit 18A when connector 20 is assembled.

In its assembled state, connector structure 22 mates with connector structure 24 and contact array structure 26 is sandwiched between boards 18A and 18B and is surrounded by connector structures 22 and 24. When structures 22 and 24 are attached to each other, contact array structure 26 is oriented so that contacts 30 short pads 32 on printed circuit 18B to respective pads 32 on printed circuit 18A.

Figure 3:
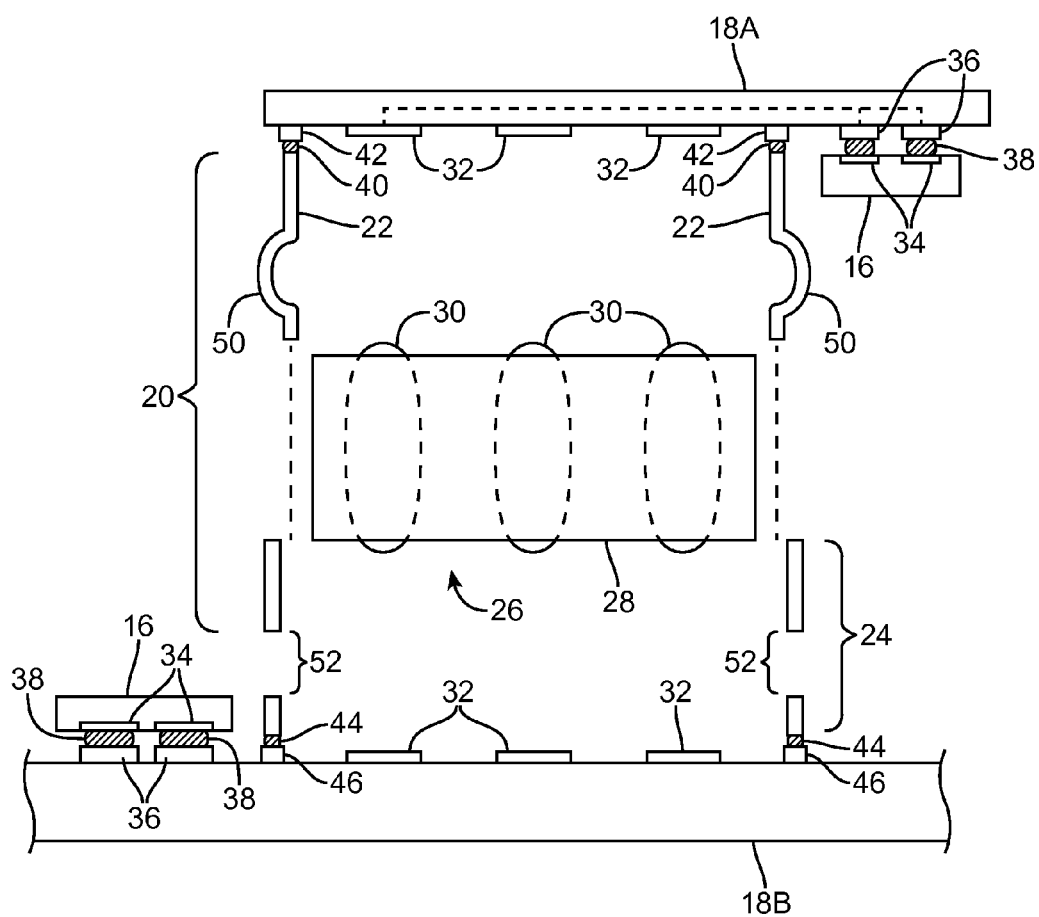
FIG. 3 is a cross-sectional side view of a pair of printed circuits being coupled by an illustrative printed circuit connector in accordance with an embodiment.

FIG. 3 is a cross-sectional side view of printed circuits such as printed circuits 18A and 18B being connected together by illustrative printed circuit connector 20. Printed circuit connector 20 of FIG. 3 has upper printed circuit connector structure 22 and lower printed circuit connector structure 24. Upper printed circuit connector structure 22 has been mounted on the lower surface of printed circuit 18A using solder 40. Solder 40 connects structure 22 to metal traces 42 on printed circuit 18A. Lower printed circuit connector structure 22 has been mounted to metal traces 46 on printed circuit 18B using solder 44.

Printed circuit connector structures 22 and 24 may be provided with mating engagement features (e.g., interlocking mechanical features such as protrusions and recesses that hold structures 22 and 24 together). As shown in FIG. 3, for example, printed circuit connector structures 22 may have protruding portion such as snaps 50 and printed circuit connector structures 24 may have mating engagement features such as holes 52 or other openings. When printed circuit structure 22 is mated with printed circuit structure 24, snaps 50 may engage holes 52 to hold connector 20 together.

When connector 20 is being held together by interlocking features on structures 22 and 24, contact array structure 26 will be held in place within connector 20. Contact array structure 26 may include dielectric carrier structure 28 and an array of conductive contacts 30. If, as an example, there are three pads 32 on printed circuit 18B and three corresponding pads 32 on printed circuit 18A as shown in FIG. 3, contact array structure 26 may have an array of three corresponding contacts 30. Each of connector contacts 30 may form an electrical path between a respective one of pads 32 on printed circuit 18B and a corresponding one of pads 32 on printed circuit 18A when printed circuit connector 20 is being used to couple printed circuits 18A and 18B together.

Circuitry such as illustrative components 16 may be mounted to printed circuits such as printed circuits 18A and 18B. Solder joints 38 or other conductive coupling structures may be used to couple pins 34 on components 16 to corresponding printed circuit pads 36. Any suitable number of components 16 may be mounted to the printed circuits being joined using printed circuit connector 20. The configuration of FIG. 3 in which a single component 16 is mounted to printed circuit 18A and in which a single component 16 is mounted to printed circuit 18B is merely illustrative.

Figure 4:
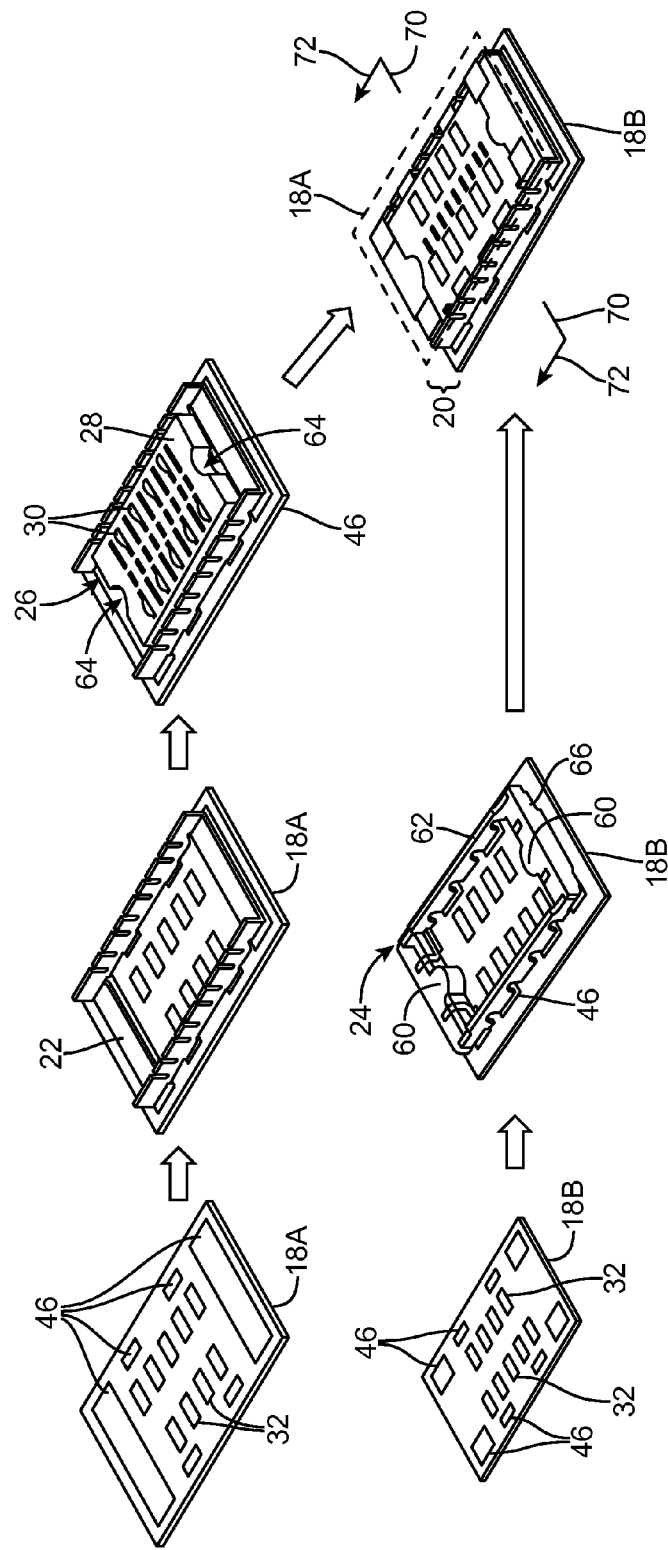
FIG. 4 is a perspective view of printed circuit connector structures being assembled to form a printed circuit connector in accordance with an embodiment.

FIG. 4 is a perspective view of illustrative structures that may be used in forming printed circuit connector 20. As shown in FIG. 4, patterned metal traces (pads) 32 and 46 may be formed on the surfaces of printed circuit boards that are to be joined using printed circuit connector 20 (e.g., on the surfaces of printed circuit boards 18A and 18B). Photolithography or other fabrication techniques may be used in forming patterned metal traces such as traces 32 and 46. Traces 32 may be arranged in a pattern of contact pads that are coupled to internal signal lines (power lines, analog data lines, digital data lines, etc.) in printed circuits 18A and 18B. Traces 46 may be used to form solder pads in configurations that allow connector structures 22 and 24 to be soldered to printed circuits 18A and 18B. If desired, internal signal paths (e.g., grounding paths) in boards 18A and 18B may be shorted to pads 46.

Following formation of patterned metal traces 32 and 46 on printed circuits 18A and 18B, connector structures 22 and 24 may be soldered to printed circuit boards 18A and 18B. Connector structures 22 and 24 may include metal frame structures and, if desired, other structures such as overmolded plastic structures. As shown in FIG. 4, for example, connector structure 24 may include overmolded plastic structures 66 on metal frame 62. Metal frame 62 may have the shape of a rectangular ring that receives contact array structure 26. Contact array structure 26 may have an array of contacts in a dielectric carrier.

Plastic structures 60 of connector structure 24 may have alignment features that mate with corresponding alignment features on contact array structure 26. For example, overmolded plastic 66 may have portions forming alignment posts 60. Alignment posts 60 may mate with corresponding alignment openings such as recesses 64 in the dielectric that makes up contact array structure 26.

Metal contacts 30 may be held in place using dielectric such as plastic carrier 28 in contact array structure 26. Metal contacts 30 may be, for example, stamped metal parts such as copper alloy pieces that have been plated or otherwise coated with a metal such as gold to help withstand corrosion. Metal contacts 30 may be press fit into slots in carrier 28 or may be formed within an overmolded version of carrier 28 (as examples).

During assembly of connector 20, contact array structure 26 is interposed between printed circuits 18A and 18B while being received within openings in structures 22 and 24. When connector structure 22 and connector structure 24 are successfully mated as shown on the right-hand side of FIG. 4, printed circuit connector 20 is formed, so that the interconnects and circuitry on printed circuit 18A can be electrically connected to the interconnects and circuitry on printed circuit 18B.

Figure 5:
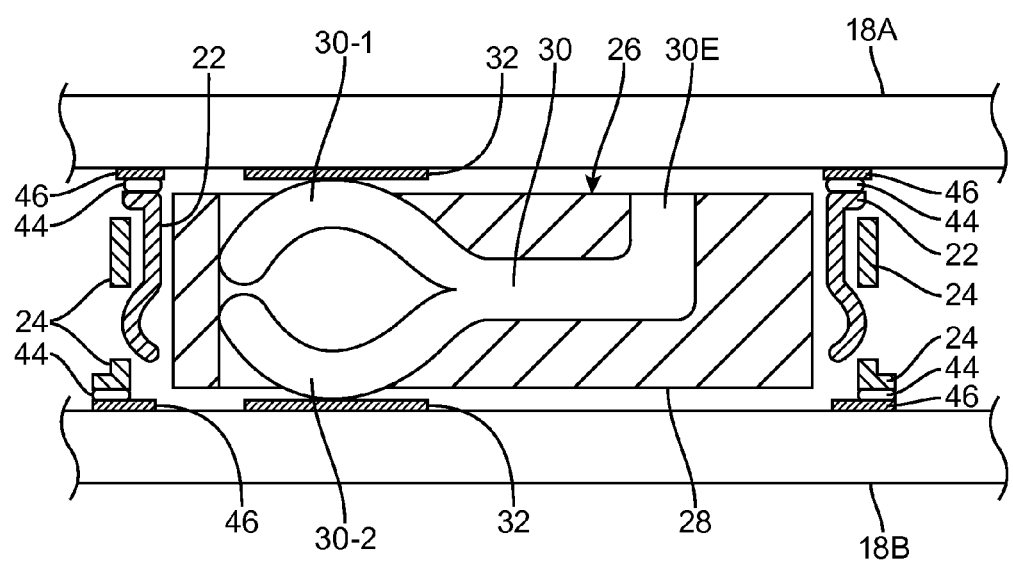
FIG. 5 is a cross-sectional side view of a pair of structures such as printed circuits being coupled using an illustrative printed circuit connector with metal contacts in a dielectric carrier in accordance with an embodiment.

If desired, metal contacts 30 in contact array structure 26 may be formed from spring-shaped metal members or other metal structures that outwardly bias portions of contacts 30 against printed circuit contact pads 32. This type of configuration is shown in FIG. 5. FIG. 5 is a cross-sectional side view of connector 20 and printed circuits 18A and 18B taken along line 70 of FIG. 4 and viewed in direction 72. As shown in FIG. 5, contact 30 may include spring structures such as upper spring portion 30-1 and lower spring portion 30-2. The metal spring structure formed from portions 30-1 and 30-2 may be formed from a conductive metal such as a copper alloy and may be coated with a metal that helps resist corrosion such as gold. When compressed between pads 32 on printed circuits 18A and 18B, spring portions 30-1 and 30-2 move towards each other while creating an outward biasing force that helps hold spring portion 30-1 against pad 32 on printed circuit 18A and that helps hold spring portion 30-2 against pad 32 on printed circuit 18B. In the illustrative configuration of FIG. 5, end portion 30E of contact 30 does not form electrical connections with any metal pads 32, but rather is used to help properly orient and secure contact 30 within plastic carrier 28 of contact array structure 26.

Figure 6:
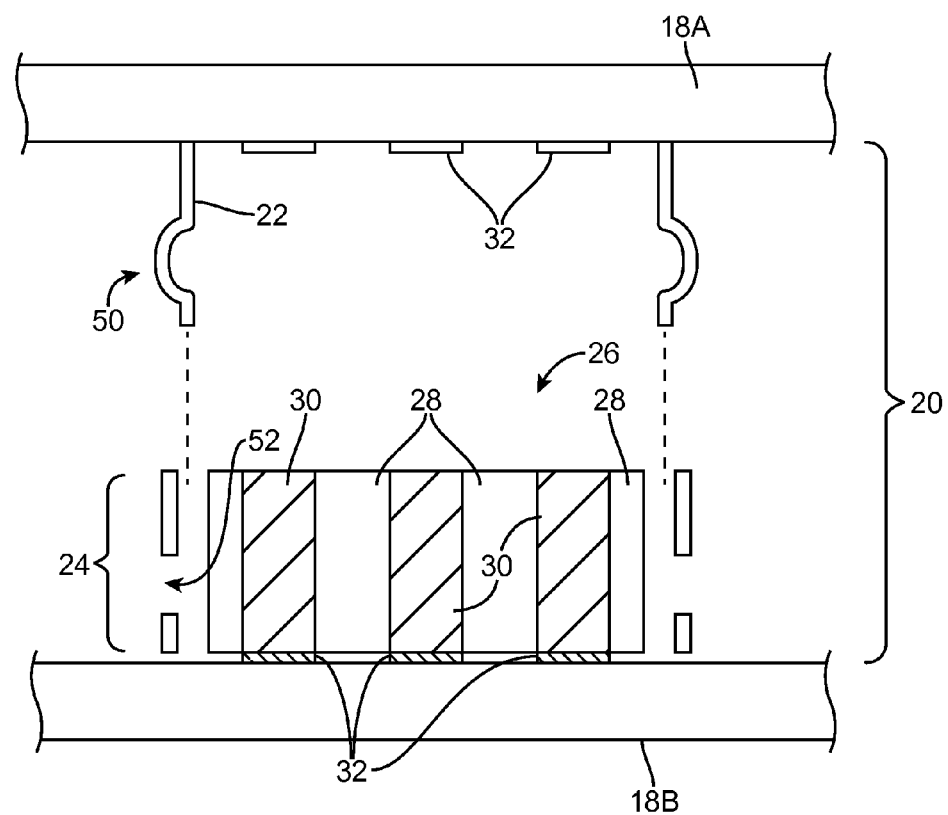
FIG. 6 an exploded cross-sectional side view of a pair of structures such as printed circuits being coupled using a printed circuit connector that has an elastomeric member with embedded conductive elastomeric contacts in accordance with an embodiment.

If desired, dielectric and conductive elastomeric structures may be used in forming contact array structure 26 for printed circuit connector 20. FIG. 6 is an exploded side view of this type of printed circuit connector. As shown in FIG. 6, printed circuit connector 20 may have printed circuit connector structure 22 (e.g., a rectangular ring-shaped metal frame with protrusions 50) on printed circuit 18A and may have printed circuit connector structure (e.g., a rectangular ring-shaped metal frame with mating openings 52) on printed circuit 18B. Structures 22 and 24 may be configured to mate with each other. Rectangular openings in the centers of structures 22 and 24 may receive a rectangular contact array structure such as structure 26, so that contacts 30 are aligned with respect to pads 32. When structures 22 and 24 are mated, contact array structure 26 may be compressed between printed circuits 18A and 18B, so that contacts 30 electrically short pads 32 on printed circuit 18B to corresponding pads 32 on printed circuit 18A.

In the illustrative configuration of FIG. 6, contact array structure 26 is formed from elastomeric structures. Dielectric elastomeric structure 28 may be a carrier structure that is formed from a dielectric such as polymer foam or other elastomeric insulator. Contacts 30 may be formed from conductive structures that are embedded within dielectric elastomeric structure 28. For example, contacts 30 may be formed from metal-impregnated elastomeric polymer structures such as silver-impregnated elastomer columns. Each conductive elastomeric structure of this type that is embedded within dielectric elastomeric carrier 28 may serve as a respective contact 30 for printed circuit connector 20.

Figure 7:
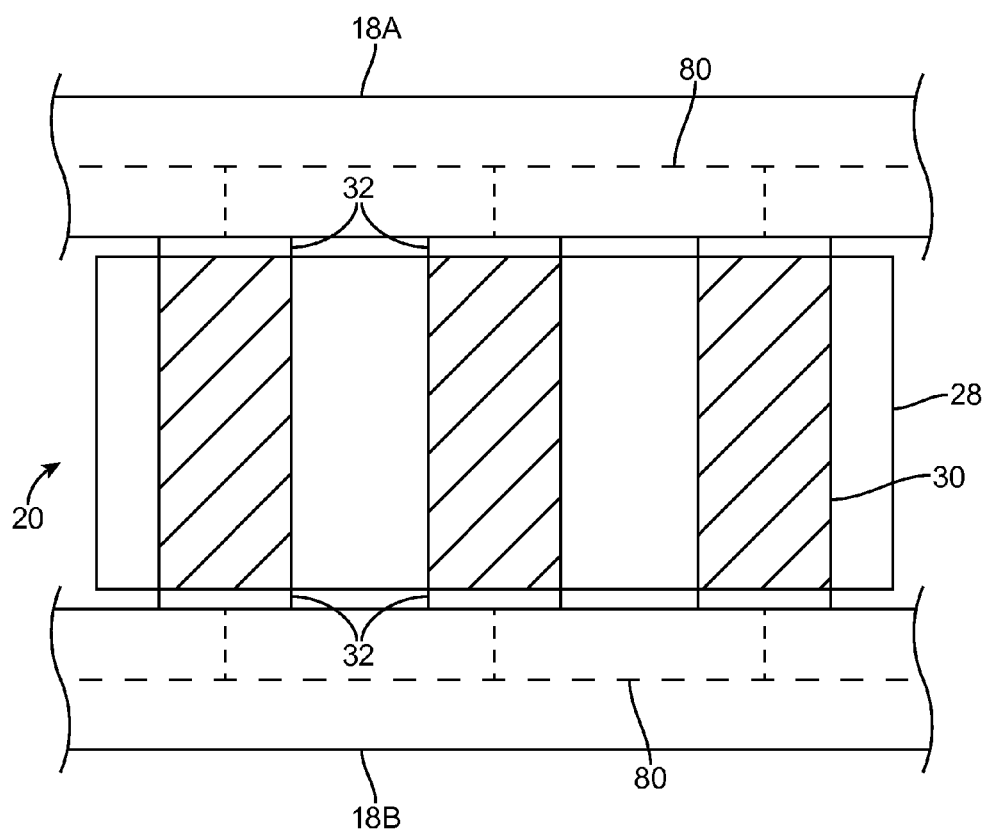
FIG. 7 is a cross-sectional side view of the structures and printed circuit connector of FIG. 6 in an assembled configuration in accordance with an embodiment.

When compressed between respective pads 32 as shown in FIG. 7, the elastomeric material that forms contacts 30 of printed circuit connector 20 may help bias contacts 30 outwards, thereby facilitating the formation of good ohmic connections between contacts 30 and pads 32 on opposing printed circuits 18A and 18B. As shown in FIG. 7, printed circuits 18A and 18B may contain metal traces 80 for distributing signals from pads 32 within printed circuits 18A and 18B (e.g., to electrically couple the circuitry of components 16 to pads 32).

Figure 8:
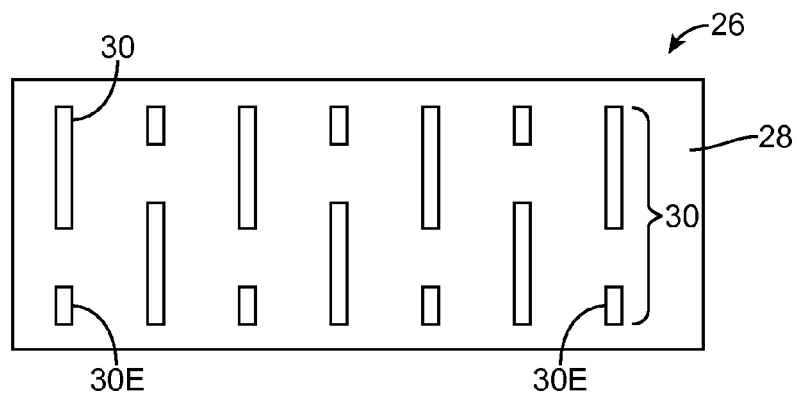
FIG. 8 is top view of an illustrative printed circuit carrier containing metal contacts in accordance with an embodiment.

FIG. 8 is a top view of an illustrative pattern of contacts 30 that may be used in connector 20 in an embodiment in which stamped metal parts are used in forming contacts 30. Ends 30E of contacts 30 can be used to help hold contacts 30 in place within plastic contact carrier 28. There are two rows of contacts 30 in the illustrative configuration of FIG. 8. In general, connector 20 may have a single contact 30, multiple contacts 30, a single row of multiple contacts 30, two rows of one or more contacts 30, two or more rows each with multiple contacts 30, or any other suitable number of contacts (i.e., any suitable number of columns and rows of contacts 30 or other pattern of contacts 30) in contact array structure 26.

Figure 9:
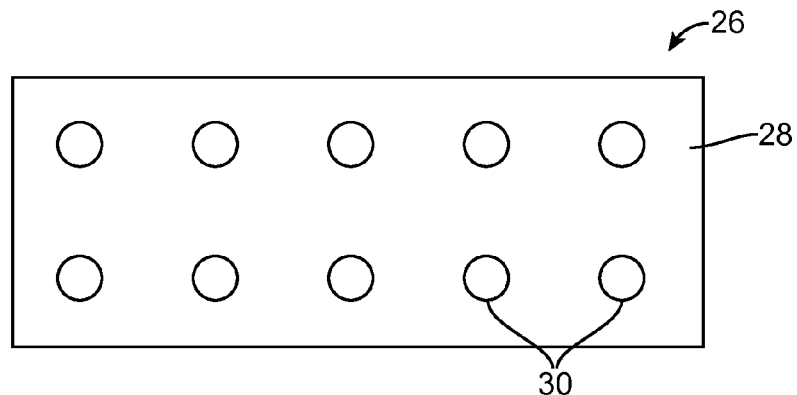
FIG. 9 is a top view of a portion of an illustrative printed circuit connector having two rows of contacts in accordance with an embodiment.

In the illustrative pattern of FIG. 9, contact array structure 26 has two rows of contacts 30. Contacts 30 may be metal structures (e.g., metal structures with integral springs) or elastomeric structures with embedded silver particles or other embedded conductive material to render the elastomeric structures conductive. The outline of each contact 30 on the surface of carrier 28 may have a circular shape (as shown in the FIG. 9 example), may have a rectangular shape, may have a square shape, or may have other suitable shapes.

Figure 10:
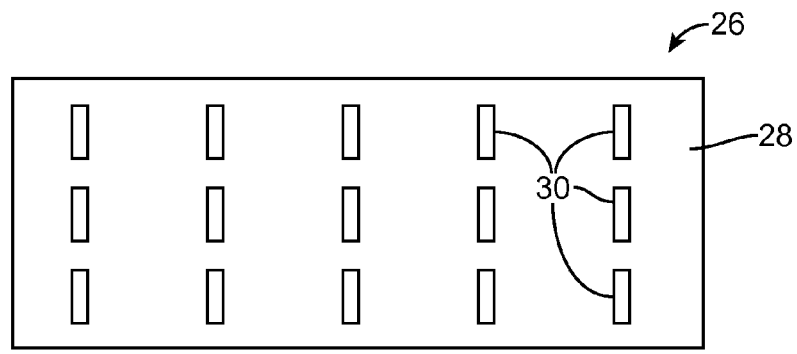
FIG. 10 is a top view of a portion of an illustrative printed circuit connector having three rows of contacts in accordance with an embodiment.
Figure 11:
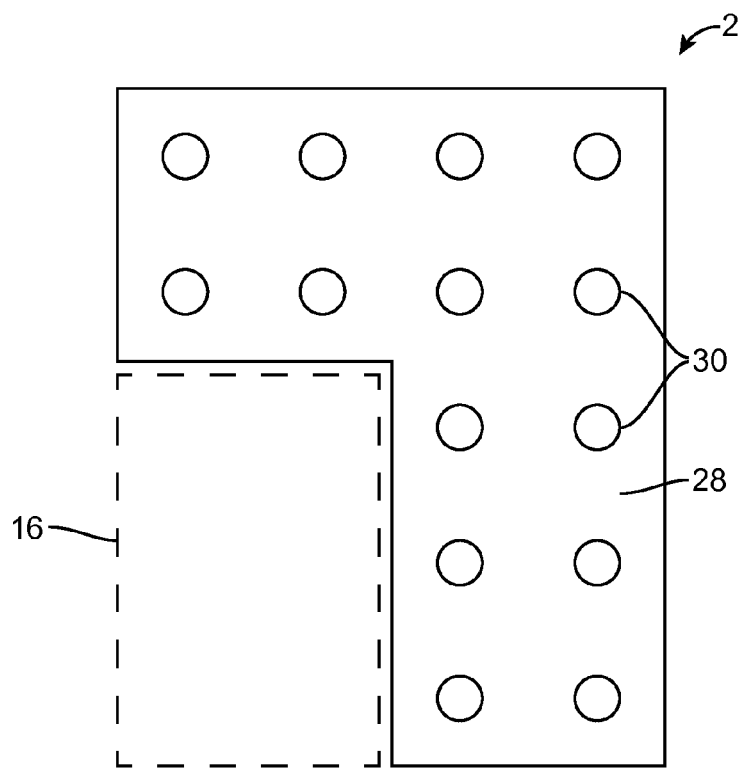
FIG. 11 is a top view of a portion of an illustrative irregularly shaped printed circuit connector such as an L-shaped connector in accordance with an embodiment.
Figure 12:
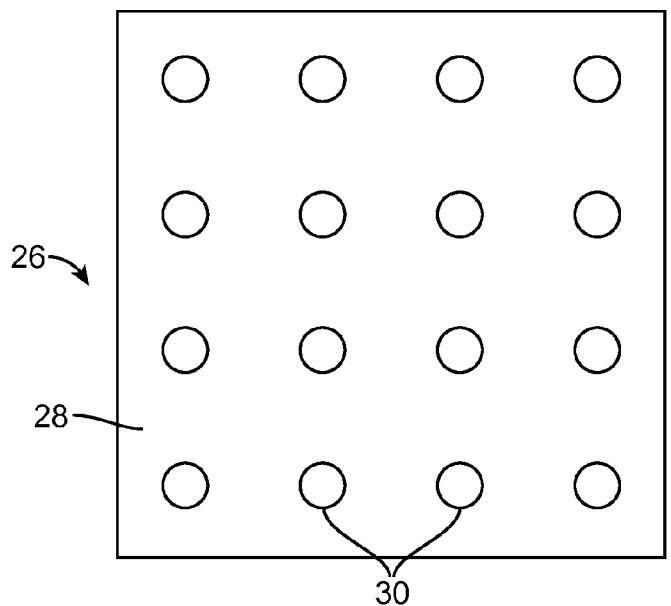
FIG. 12 is a top view of a portion of an illustrative square printed circuit connector in accordance with an embodiment.

FIG. 10 shows how contact array structure 26 may have an array of contacts 30 arranged in three rows to form a rectangular array that has a more square aspect ratio than illustrative contact array structure 26 of FIG. 9. If desired, contact array structure 26 and connector 20 may have an irregular outline. As shown in FIG. 11, for example, connector 20 and contact array structure 26 may have an L-shaped footprint. Use of an L-shaped outline for contact array structure 26 may help contact array structure 26 and connector 20 accommodate nearby components such as adjacent component 16. FIG. 12 shows how contact array structure 26 may have a 1:1 aspect ratio (i.e., connector 20 and contact array structure 26 may have a square footprint). Use of a square outline for printed circuit connector 20 may help connector 20 form a dense set of electrical board-to-board connections (i.e., a relatively large number of connections per unit board area).

Printed circuit connectors 22 and 24 may have a rectangular frame shape with a rectangular opening or may have other suitable opening shapes. Tape or other structures may be used to mask the rectangular opening of each printed circuit connector while depositing a coating layer on the printed circuits to prevent solder corrosion.

Figure 13:
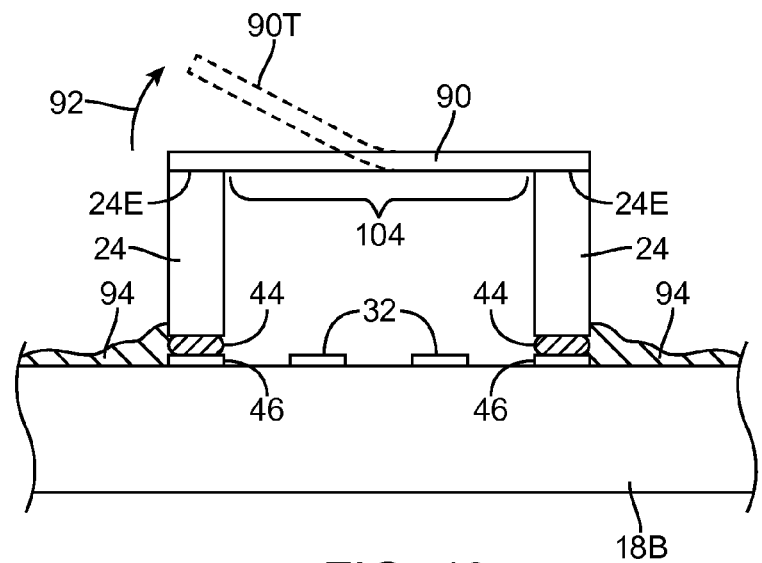
FIG. 13 is a cross-sectional side view of printed circuit connector structures being masked during coating deposition operations using tape that is attached to the exposed outer edge of the printed circuit connector structures in accordance with an embodiment.

Consider, as an example, the configuration of FIG. 13. In the FIG. 13 example, printed circuit connector 24 has been attached to printed circuit 18B by using solder 44 to solder printed circuit connector 24 to metal traces (pads) 46 on printed circuit 18B. Solder 44 may be susceptible to corrosion. Accordingly, a protective polymer layer such as polymer coating 94 may be formed on printed circuit 18B. As shown in FIG. 13, polymer coating 94 may cover solder 44 and thereby prevent solder 44 from being exposed to the environment and subjected to possible corrosion.

During deposition of polymer coating 94, a masking structure such as tape 90 may be formed over rectangular opening 104 in printed circuit connector structure 24. Tape 90 may be, for example, a sheet of polymer coated with a layer of pressure sensitive adhesive. The adhesive of tape 90 may be used to attach tape 90 to upper edge 24E of connector structure 24. Edge 24E may have the shape of a rectangular ring that surrounds rectangular opening 104. The presence of tape 90 over opening 104 during deposition of polymer coating 94 may help prevent insulating polymer coating 94 from covering and thereby contaminating the surfaces of pads 32, which could hinder the formation of satisfactory electrical connections between contacts 30 and pads 32. Following formation of coating layer 94, tape 90 may be peeled off of printed circuit connector 24 by pulling upwards in direction 92 on end 90T of tape 90 (as an example).

Figure 14:
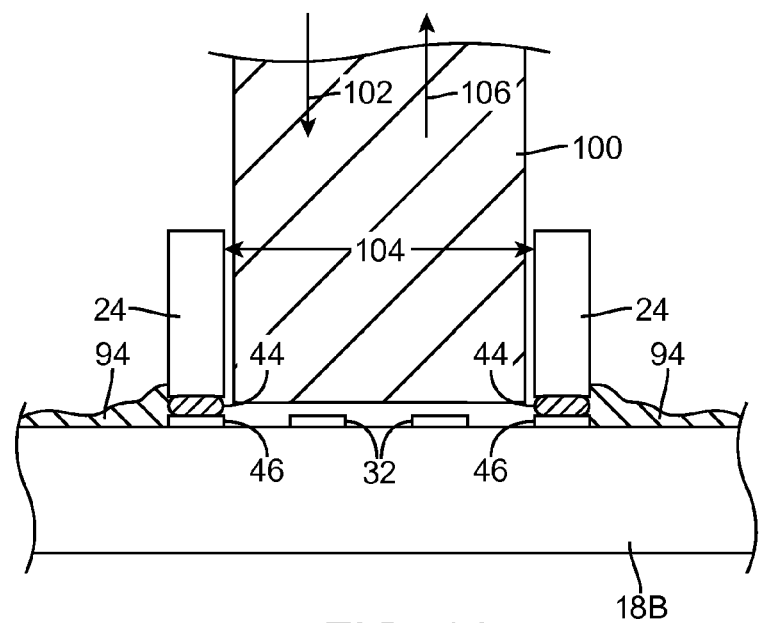
FIG. 14 is a cross-sectional side view of printed circuit connector structures being masked during coating deposition operations using a movable fixture in accordance with an embodiment.

FIG. 14 shows how computer controlled fixture 100 may be placed into opening 104 of printed circuit connector 24 during deposition of polymer coating 94 to cover and thereby protect solder 44. Fixture 100 may be formed from materials such as plastic and/or metal and may be positioned using a computer-controlled positioner. When it is desired to protect pads 32 from coating 94, fixture 100 may be moved in direction 102 to cover pads 32 as shown in FIG. 14. Following formation of coating 94, fixture 100 may be moved in direction 106 to remove fixture 100 from opening 104 of printed circuit connector structure 24.

The foregoing is merely illustrative and various modifications can be made by those skilled in the art without departing from the scope and spirit of the described embodiments. The foregoing embodiments may be implemented individually or in any combination.

What is claimed is:

1. A printed circuit connector for connecting first metal pads on a first structure to second metal pads on a second structure, comprising:
   a first printed circuit connector structure;
   a second printed circuit connector structure that mates with the first printed circuit connector structure; and
   a contact array structure interposed between the first structure and the second structure and surrounded by the first and second printed circuit connector structures so that contacts in the contact array structure make electrical connections between the first metal pads and the second metal pads.

2. The printed circuit connector defined in claim 1 wherein the first and second printed circuit connector structures have interlocking engagement features.

3. The printed circuit connector defined in claim 1 wherein the first printed circuit connector structure has protrusions and wherein the second printed circuit connector structure has openings that are configured to receive the protrusions to hold the first and second printed circuit connector structures together.

4. The printed circuit connector defined in claim 1 wherein the first and second printed circuit connector structures comprise interlocking metal frames.

5. The printed circuit connector defined in claim 4 wherein the interlocking metal frames comprise rectangular frames with rectangular openings.

6. The printed circuit connector defined in claim 5 wherein the contact array structure has a rectangular footprint and is received within the rectangular openings.

7. The printed circuit connector defined in claim 6, wherein the contacts comprises metal members and wherein the contact array structure comprises a plastic rectangular carrier that aligns the metal members with respect to the pads.

8. The printed circuit connector defined in claim 7 wherein the metal members each comprise a metal spring structure coated with a metal coating.

9. The printed circuit connector defined in claim 6 wherein the contact array structure comprises an elastomeric dielectric carrier structure and wherein the contacts comprise conductive elastomeric structures embedded within the elastomeric dielectric carrier structure.

10. A printed circuit connector, comprising:
 a first metal frame configured to attach to a first printed circuit board that has a first array of metal contact pads;
 a second metal frame configured to attach to a second printed circuit board that has a second array of metal contact pads;
 a plurality of contacts interposed between the first array of metal contact pads and the second array of metal contact pads; and
 a dielectric carrier that is separate from the first and second metal frames and that aligns the contacts with the first and second arrays of metal contact pads so that each metal contact pad in the first array of metal contact pads is shorted by a respective one of the contacts to a corresponding one of the metal contact pads in the second array of metal contact pads.

11. The printed circuit connector defined in claim 10 wherein the contacts each comprise a metal spring.

12. The printed circuit connector defined in claim 11 wherein each metal spring has a first portion configured to press against a metal contact pad in the first array and a second portion configured to press against a metal contact pad in the second array.

13. The printed circuit connector defined in claim 10 wherein each contact comprises a column of elastomer impregnated with metal.

14. The printed circuit connector defined in claim 10 wherein the first metal frame has a rectangular ring shape that surrounds the first array of metal contact pads and wherein the second metal frame has a rectangular ring shape that surrounds the second array of metal contact pads.

15. The printed circuit connector defined in claim 14 further comprising plastic structures attached to the second metal frame, wherein the plastic structures have portions that align the dielectric carrier with respect to the second metal frame.

16. The printed circuit connector defined in claim 15 wherein the dielectric carrier has openings and wherein the portions comprise plastic alignment posts that mate with the openings.

17. A board-to-board printed circuit connector configured to electrically connect a first set of printed circuit board pads on a first printed circuit to a second set of printed circuit board pads on a second printed circuit, the board-to-board printed circuit connector comprising:
 a first metal member configured to be soldered to the first printed circuit;
 a second metal member configured to be soldered to the second printed circuit; and
 a contact array structure that is separate from the first and second metal members, wherein the contact array structure includes a dielectric carrier structure that is received within openings in the first and second metal members and an array of contacts that are aligned with respect to the first and second sets of printed circuit board pads by the dielectric carrier structure.

18. The board-to-board connector defined in claim 17 wherein the first metal member comprises protrusions and wherein the second metal member comprises holes that receive the protrusions.

19. The board-to-board connector defined in claim 18 wherein the contacts comprise conductive elastomeric structures that are compressed when the holes receive the protrusions.

20. The board-to-board connector defined in claim 18 wherein the contacts comprise spring structures that are compressed when the holes receive the protrusions.

\* \* \* \* \*